(12) United States Patent
Andersen et al.

(10) Patent No.: US 8,381,161 B1
(45) Date of Patent: Feb. 19, 2013

(54) METHOD FOR PROVIDING A SECURE "GRAY BOX" VIEW PROPRIETARY IP

(75) Inventors: William R. Andersen, Milton, VT (US); Oded Katz, Haifa (IL); Rina Kipnis, Karmiel (IL); Lansing D. Pickup, Raleigh, NC (US); Christopher B. Reynolds, Milton, VT (US); Joseph H. Underwood, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/289,140

(22) Filed: Nov. 4, 2011

(51) Int. Cl.
G06F 17/50 (2006.01)

(52) U.S. Cl. .......... 716/119; 716/55; 716/111; 716/112; 716/139

(58) Field of Classification Search .................. 716/55, 716/111, 112, 119, 139
See application file for complete search history.

(56) References Cited

U.S. PATENT DOCUMENTS

| | | | |
|---|---|---|---|
| 5,903,578 A | 5/1999 | De et al. | |
| 6,697,982 B2 | 2/2004 | Chakravarthy et al. | |
| 6,882,950 B1 | 4/2005 | Jennion et al. | |
| 7,107,567 B1 * | 9/2006 | LeBlanc | 716/106 |
| 7,139,949 B1 | 11/2006 | Jennion et al. | |
| 7,265,573 B1 | 9/2007 | Wright | |
| 7,409,652 B1 * | 8/2008 | Fox et al. | 716/106 |
| 7,774,723 B2 | 8/2010 | Banerjee | |
| 7,870,381 B2 | 1/2011 | Hekmatpour et al. | |
| 2005/0071792 A1 | 3/2005 | Ferguson et al. | |
| 2006/0075374 A1 | 4/2006 | McElvain | |
| 2008/0208886 A1 | 8/2008 | Zhang | |
| 2011/0286599 A1 * | 11/2011 | Tuyls et al. | 380/278 |

OTHER PUBLICATIONS

Chapman, et al., "IP Protection of DSP Algorithms for System on Chip Implementation," IEEE Transactions on Signal Processing, vol. 48, No. 3, Mar. 2000, pp. 854-861.

* cited by examiner

Primary Examiner — Vuthe Siek
Assistant Examiner — Brian Ngo
(74) Attorney, Agent, or Firm — Gibb & Riley, LLC; Richard M. Kotulak, Esq.

(57) ABSTRACT

A computer-implemented method identifies at least one proprietary geometric figure from a plurality of geometric figures within a design data layout format file. The proprietary geometric figure in the design data layout format file may be replaced with a placeholder geometric figure. Cell names and connection names associated with the proprietary geometric figure are renamed from a netlist file that defines electrical connections between the geometric figures with obfuscating names. A modified design data layout format file may be generated that includes the placeholder geometric figure and a modified netlist file including the obfuscating names. The modified file enables IC designers to complete their design and checking activities, but inhibits reverse-engineering of the proprietary geometric & netlist data.

20 Claims, 12 Drawing Sheets

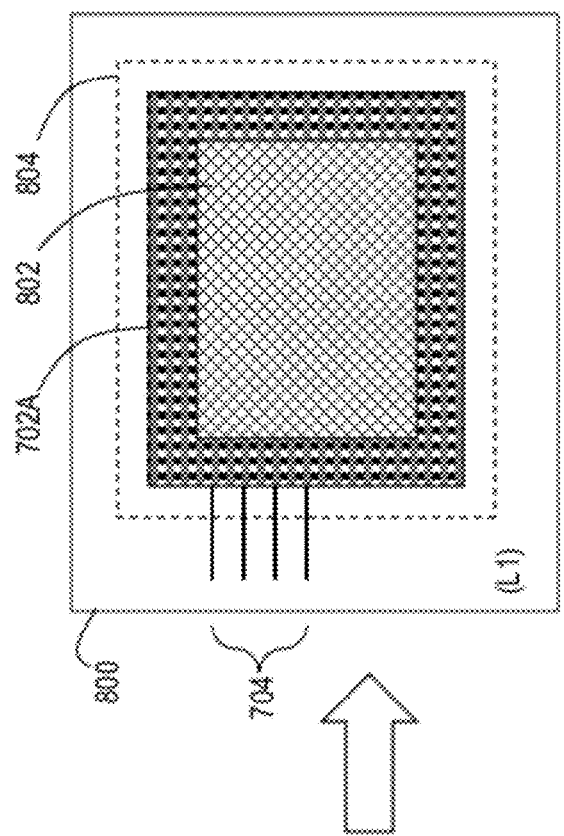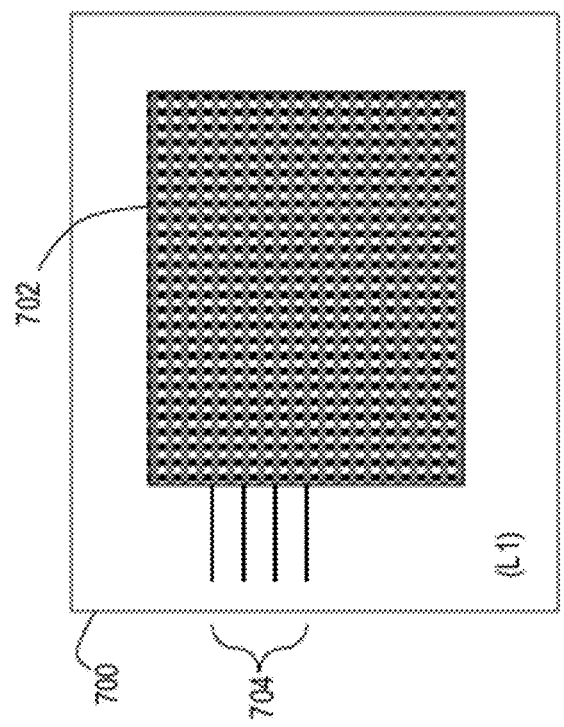
Fig. 4

METHOD FOR PROVIDING A SECURE "GRAY BOX" VIEW PROPRIETARY IP

BACKGROUND

The methods and systems herein relate to providing foundry customers with Integrated Circuit (IC) graphic design data files for photomask plotting that allow for full place, route & checking capability of proprietary Intellectual Property (IP), while the IP developer cloaks the internal structure of the IP when viewed by the customer, typically an IC designer. This cloaking allows IC designers to use the IP developer's proprietary IP within their chip designs, while protecting the developer's IP from reverse-engineering by the customer, or others who have access to the IC data. This cloaking may be achieved by generating non-proprietary modified graphic data file(s) and netlist file(s) for the proprietary IP. These modified files are provided to 'non-trusted' IC design teams, instead of the original proprietary files. The modified files enable the IC design teams to complete all the necessary IC design and checking activities, using standard IC design software and design techniques—without requiring encryption or other non-standard design software or techniques. The final IC design may be then released to a 'trusted' IC fabrication facility, where the non-proprietary graphic data file(s) are replaced with the original proprietary file(s), prior to the fabrication process.

IC graphic data files, i.e., commonly used GDSII or OASIS data files, are used in the design of ICs and give complete IP design information to customers by IP developers, and are therefore not advantageous in their unmodified state to be given to customers. Once the customers have added their designs to the IC graphic data files, the IC graphic data files are given to IC foundries for final IC fabrication.

Objects contained in an IC graphic data file are grouped by assigning numeric and/or hierarchical attributes to them including a "layer number," "datatype" or "texttype". These graphic data files encapsulate hierarchical layout data for interchange between computer design systems, mask writing tools and mask inspection/mask repair tools.

Generally, the data within an IC's graphic data files may be organized hierarchically by cell with, in some instances, lower-level references to other dependent cells. Ideally, all cell layout data may be based on foundry-verified process data. A cell can be a simple (NAND gate, OR gate, XOR gate, etc.) logic circuit or it can comprise as much as the entire functionality for an embedded microprocessor. The content of the cell may be arbitrarily defined according to its anticipated use when connected with other cells during logic design. Mostly, a library file contains layer-by-layer transistor-level geometric (polygons) and non-geometric data that represents how, at the cell level, the cell should be manufactured.

A finished logic design shows how a set of cells chosen from a cell library for a particular design are to be connected. Chip-level layout design uses a netlist from logic design to place cell-level library files from the same library, (and/or multiple other sources), used in logic design and then add the routing that connects the placed cells together as one integrated circuit. After chip-level optimizations are made, the final output may be a single design data file containing optimized but still raw placement, routing and cell layer data for the entire integrated circuit.

Typically, the raw design layout data still requires finishing so that the layout, when transformed from data to shaped flashing beams of light and electrons actually print onto a mask or wafer as intended. Once finished, the modified layout of the chip may be fractured from a polygon-based representation to a geometrically equivalent representation of the data using smaller (machine-printable) geometric shapes. The fractured data may be stored separately as a fractured design data file.

Mask data preparation (MDP) is the step that translates an intended set of polygons on an integrated circuit layout into a form that can be physically written by the photomask writer. Usually this involves fracturing complex polygons into simpler shapes, often rectangles and trapezoids that can be written by the mask writing hardware. Typically a design may be delivered to mask data preparation in GDSII or OASIS format, and after fracturing is written out in a proprietary format specific to the mask writer.

SUMMARY

According to one example of the methods and systems herein, a computer-implemented method includes a first computing device that generates a design data layout format file that defines a plurality of geometric figures and a netlist file that defines electrical connections between the geometric figures. The first computing device identifies one proprietary geometric figure from the geometric figures. The identifying process further includes, identifying an outer boundary of the proprietary geometric figure, identifying electrical interconnections to and from the proprietary geometric figure that pass through the outer boundary, and identifying specific peripheral structures of the proprietary geometric figure immediately adjacent the outer boundary. The first computing device then replaces the proprietary geometric figure in the design data layout format file with a placeholder geometric figure based on the identification of the proprietary geometric figure, and renames cell names and connection names associated with the proprietary geometric figure from the netlist file with obfuscating names also based on the identification of the proprietary geometric figure. The first computing device then generates a modified design data layout format file including the placeholder geometric figure and a modified netlist file including the obfuscating names.

According to another example of the methods and systems herein, a computer-implemented method herein identifies at least one proprietary geometric figure from a plurality of geometric figures within a design data layout format file. The proprietary geometric figure in the design data layout format file may be replaced with a placeholder geometric figure based on the process of identifying the proprietary geometric figure. Cell names and connection names associated with the proprietary geometric figure are renamed from a netlist file that defines electrical connections between the geometric figures with obfuscating names based on the process of identifying the proprietary geometric figure. A modified design data layout format file may be generated that includes the placeholder geometric figure and a modified netlist file including the obfuscating names.

According to another example of the methods and systems herein, a non-transitory computer storage medium readable by a computer tangibly embodies a program of instructions executable by the computer for performing a method for generating a modified design data layout format file and a modified netlist file. The method generates a design data layout format file that defines a plurality of geometric figures and a netlist file that defines electrical connections between the geometric figures. At least one proprietary geometric figure may be identified from the geometric figures. The identifying process further includes, identifying an outer boundary of the proprietary geometric figure, identifying electrical interconnections to and from the proprietary geometric figure that pass through the outer boundary, and identifying specific peripheral structures of the proprietary geometric figure immediately adjacent the outer boundary. The proprietary geometric figure may be replaced in the design data layout format file with a placeholder geometric figure based on the identification of the proprietary geometric figure, and the method renames cell names and connection names associated with the proprietary geometric figure from the netlist file are replaced with obfuscating names also based on the identification of the proprietary geometric figure. A modified design data layout format file may be generated that includes the placeholder geometric figure and a modified netlist file may be generated that includes the obfuscating names.

BRIEF DESCRIPTION OF THE SEVERAL VIEWS OF THE DRAWINGS

The examples of the methods and systems herein will be better understood from the following detailed description with reference to the drawings, which are not necessarily drawn to scale and in which:

FIG. 4 is a schematic diagram of another embodiment illustrating additional features of a design data layout format file and netlist file being modified from a first form to a second form;

DETAILED DESCRIPTION

Existing technology that hides IP on graphic design data files includes a Library Exchange Format (LEF) that provides place and route capability for customers, but fails to provide full Design Rule Checking (DRC) and Layout verses Schematic (LVS) on the graphic data files.

The method of the embodiment described herein discloses a 'grey box' graphic data file view of proprietary IP that the IP developer generates based on the graphic data file before sending it to the customer to prevent the IP from being viewed or reverse engineered by the customer. This modification of the graphic design file allows customers to complete all aspects of their chip design and DRC/LVS checking, while preventing the details of the IP's transistor-level design from being observed.

Figure 1:
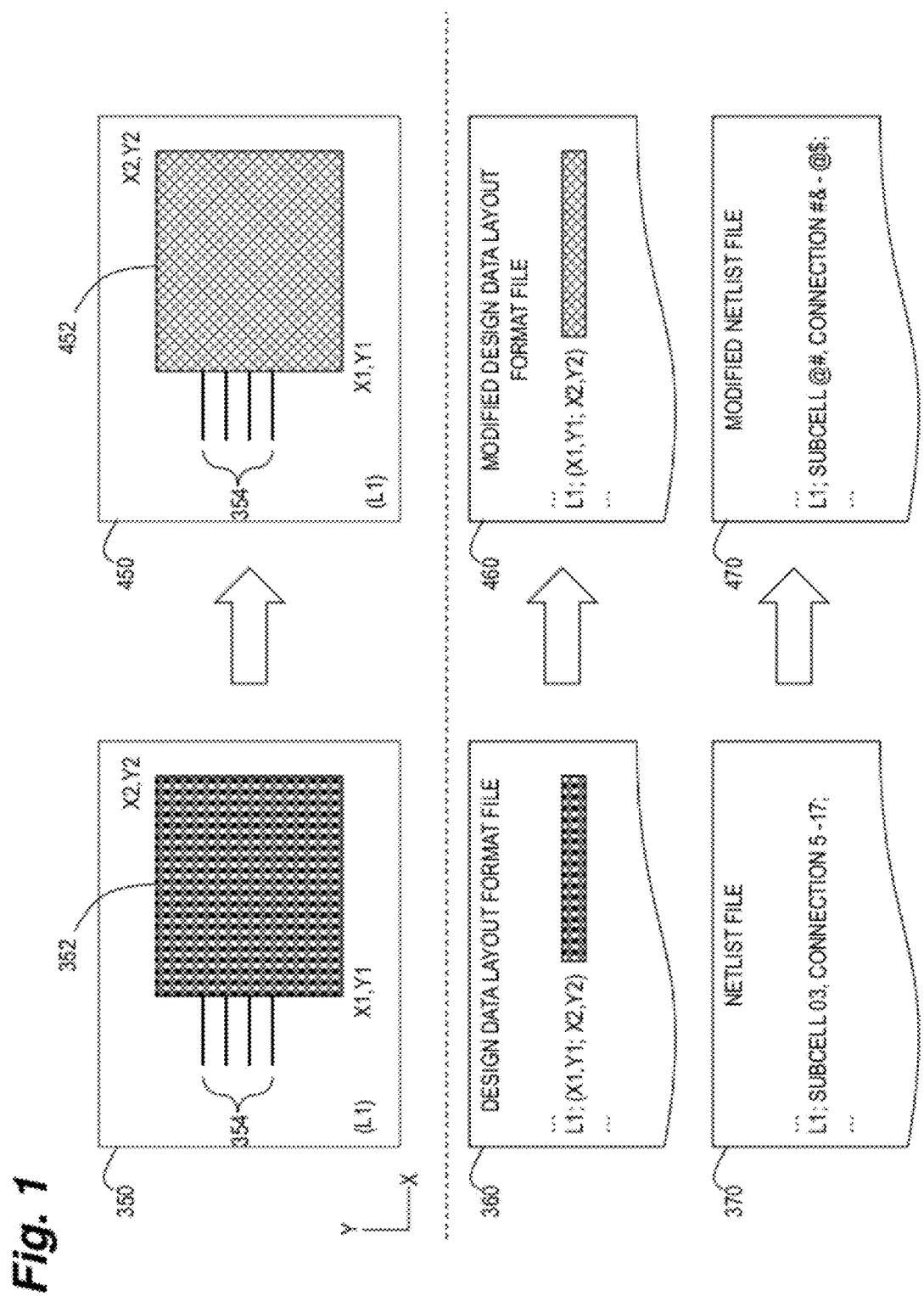
FIG. 1 is a schematic diagram of one embodiment of a graphical representation of a design data layout format file and netlist file being modified from a first form to a second form.

FIG. 1 illustrates a first graphical representation of a layout 350 for an IC design including a portion of the layout that includes a proprietary ("IP") portion 352. This proprietary portion 352 on the layout 350 may include anything from a complete VSLI (Very Large-Scale Integrated) circuit, e.g., an entire processing core, to any smallest discrete portion of a VSLI circuit design. For purposes of illustration, IP portion 352 has physical dimensions between (X1,Y1) and (X2,Y2) in an X-Y coordinate plane. Connections 354 are represented by lines protruding from the IP portion 352 into the layout 350. Additionally, IP portion 352 may lie on a single level L1 of the IC design as illustrated. A design data layout format file 360 associated with the graphical layout 350, (e.g., a GDSII or an OASIS file), may include layer (L1) information with associated geometry data (X1,Y1); (X2,Y2) of the IP portion 352 and other elements within the layout 350. A net list file 370 associated with the graphical layout 350 may include layer information (L1) with associated cell/subcell data (SUBCELL 03) and connectivity data (CONNECTION 5 TO 17) associated with the IP portion 352 and other elements within the layout 350.

The graphical layout 350 may be then modified by the IP developer resulting in a modified graphical layout 450 that includes a grey-box or placeholder IP portion 452 between the identical coordinates (X1,Y1) to (X2,Y2) of the original IP portion 352. For purposes herein the "placeholder" IP portions could be considered "grey"; "cloaked"; "generic"; or "dummy" elements because the details of such elements are not available to the viewer (and this maintains the security of the IP developer's intellectual property rights). Connections 354 are still maintained in the modified graphical layout in the same positions as in the original layout 350 for the customer to implement and test their added design. A modified design data layout format file 460 now identifies the placeholder IP portion 452 on a layer (L1) and on a coordinate basis (X1,Y1); (X2,Y2), and a modified netlist file 470 replaces the cell/subcell names and connection names of the original netlist file 370 with obfuscating names to obfuscate any proprietary data a customer could deduce from the original name of any cell/subcell and connection names.

Figure 2:
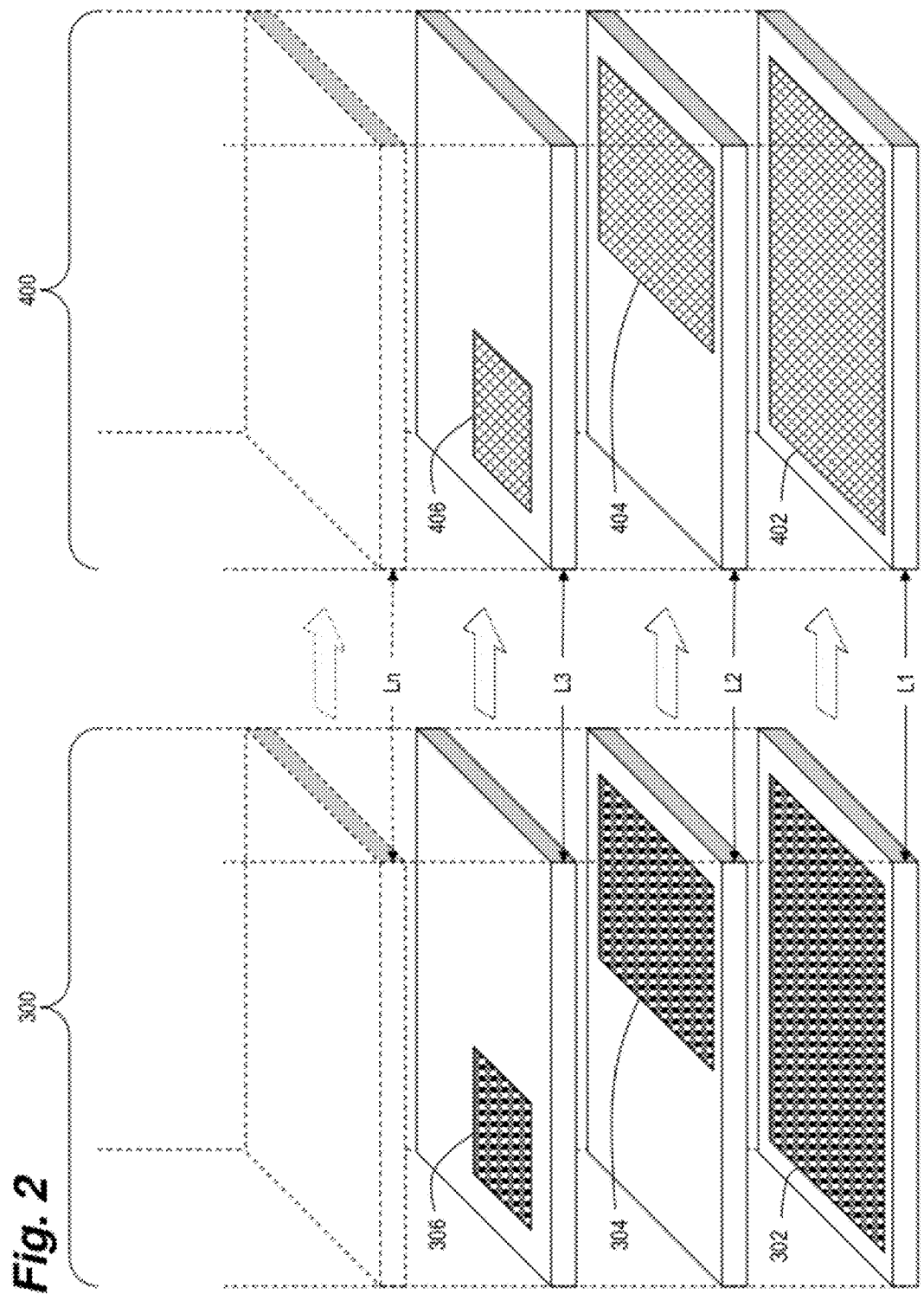
FIG. 2 is a schematic diagram of another embodiment illustrating a plurality of layers of a representation of a graphic data file.

FIG. 2 illustrates another embodiment where an IC design layout represents a plurality of layers, L1, L2, L3 to Ln. In a first IC design layout 300, an IP portion 302 occupies a substantial portion of layer L1; IP portion 304 occupies a portion of layer L2; IP portion 306 occupies a relatively small portion of layer L3; while layer Ln fails to have any IP portion. Each of these IP portions, 302, 304 and 306 may be replaced with placeholder IP portions 402, 404 and 406 respectively in a modified IC design layout 400 with modification to a respective design data layout format file and netlist file similar to those shown in FIG. 1.

Figure 3:
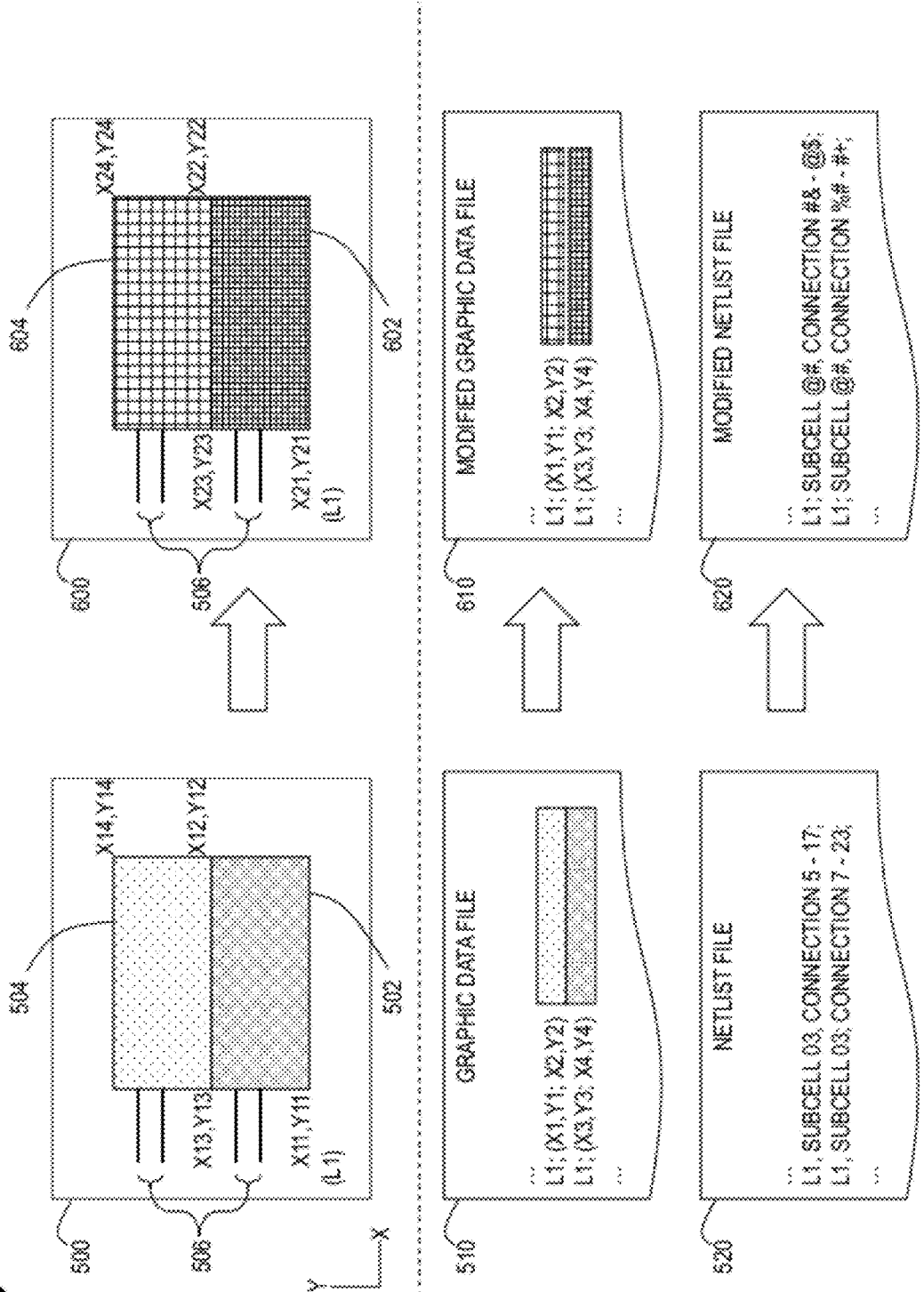
FIG. 3 is a schematic diagram of another embodiment of a graphical representation of a design data layout format file and netlist file being modified from a first form to a second form.

FIG. 3 illustrates another embodiment where an IP portion that may be replaced with a placeholder IP portion in the design data layout format file and netlist file may be replaced with multiple sections within the placeholder IP portion that have different device densities or different metal densities of normal arrays reflective of the original IP portions device and metal densities for purposes of better accuracy in DRC and LVS checking.

In layout 500, a first IP portion 502 has the coordinates of (X11,Y11) to (X12,Y12) on level L1, and a second IP portion 504 has the coordinates of (X13,Y13) to (X14,Y14) on the same level L1. Electrical connectors 506 pass from both of these sections into the non-IP portion of the layout 500. Additionally, electrical connectors may pass from both the first IP portion 502 to the second IP portion 504, (not shown). Likewise, the graphic data file 510 reflects the first 502 and second 504 IP portions and the netlist file 520 represents level, cell/subcell and electrical connection data for each element.

In the modified layout 600, a first placeholder IP portion 602 has the coordinates of (X21,Y21) to (X22,Y22) on level L1, and a second placeholder IP portion 604 has the coordinates of (X23,Y23) to (X24,Y24) on the same level L1. However, for example, the first placeholder IP portion 602 may be replaced with a regular array of devices or metal in the form of geometric shapes having a first density per unit of area corresponding to an equivalent density per unit of area of the original IP portion 502. Likewise, the second placeholder IP portion 604 may be replaced with a regular array of devices or metal in the form of geometric shapes having a second different density per unit of area corresponding to an equivalent density per unit of area of the original IP portion 504. This facilitates the more accurate checking of the customer's added design by mimicking discrete density areas within the IP portion by corresponding placeholder IP portions with similar device and metal densities.

Electrical connectors 506 pass from both of these placeholder IP sections into the non-IP portion of the layout 600. Additionally, electrical connectors may pass from both the first placeholder IP portion 602 to the second placeholder IP portion 604, and vice versa, (not shown). Likewise, the modified graphic data file 610 reflects the first 602 and second 604 placeholder IP portions, and the modified netlist file 620 represents level, replacement of the cell/subcell names and electrical connection name data for each element similar to FIG. 1.

FIG. 4 illustrates an alternative embodiment where an original IC layout 700 includes an IP portion 702 on a level L1 having electrical connections 704. In one embodiment, a modified IC layout 800 includes a portion of the IP 702 being replaced with a placeholder IP portion 802, thereby leaving a boundary portion of a fixed width, (for example 40 µm), or variable width, (which may be determined, based on DRC checking requirements, or other design considerations), from the inner boundary of the IP portion 702. Thus, an exposed portion 702A remains around the placeholder IP portion 802 that better allows customers to view electrical interconnections and other elements necessary for design and checking of their added circuit features.

Additionally, a boundary 804, consisting of metal, polysilicon, etc., may be inserted around the IP portion 702/702A/802 to allow for an error to be generated by the DRC/LVS checking if the customer places any features that intersect or are completely inside the metal boundary 704. The addition of null value devices, i.e., null "LVS resistor" structures or net names text labels around at least a portion of the placeholder geometric figure ensures that electrical shorts are identified during layout versus schematic checks on the modified design data layout format file and the modified netlist file.

Figure 5:
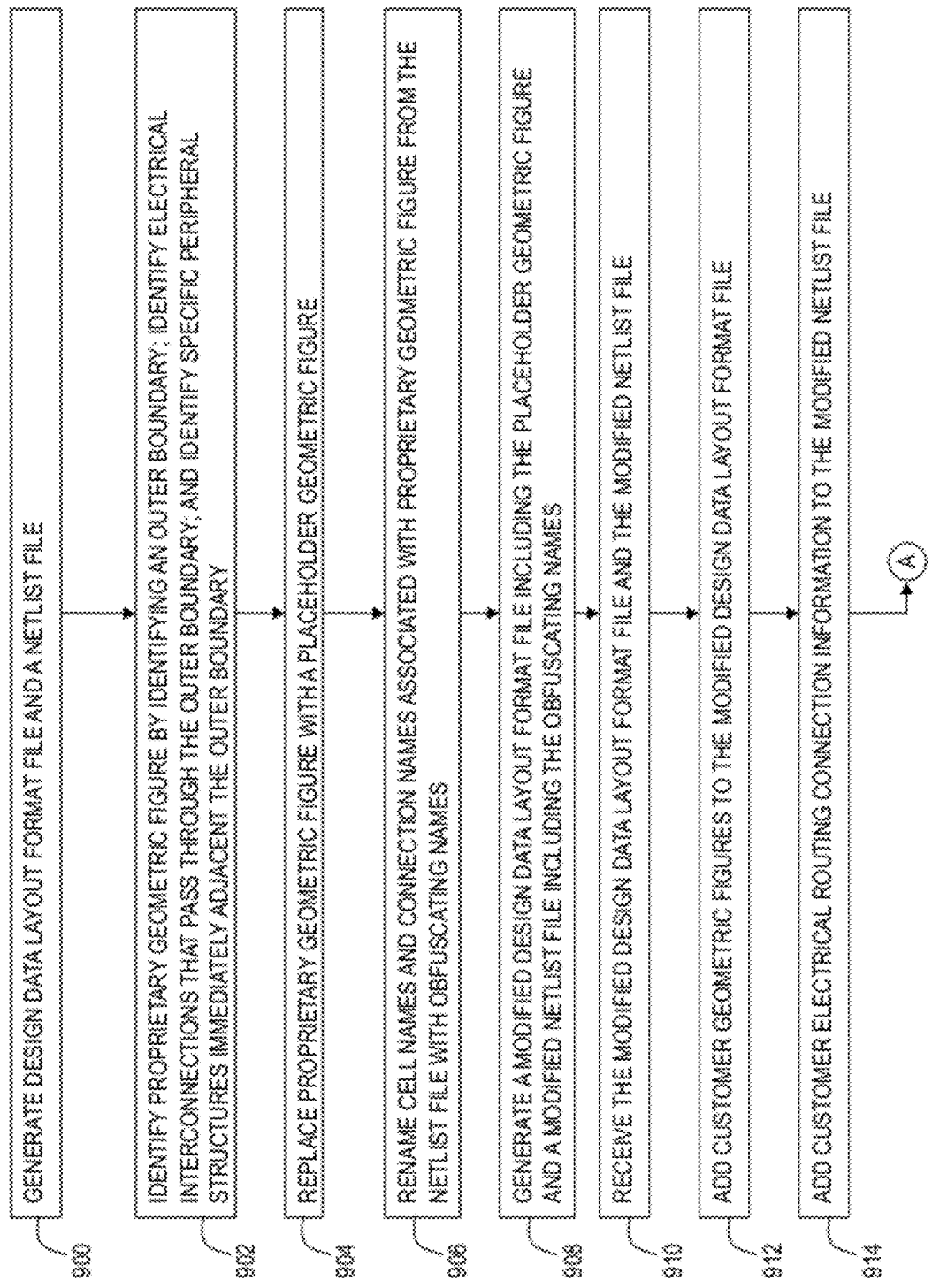
FIG. 5 is a logic flowchart for an embodiment of a method of the modification process.
Figure 6:
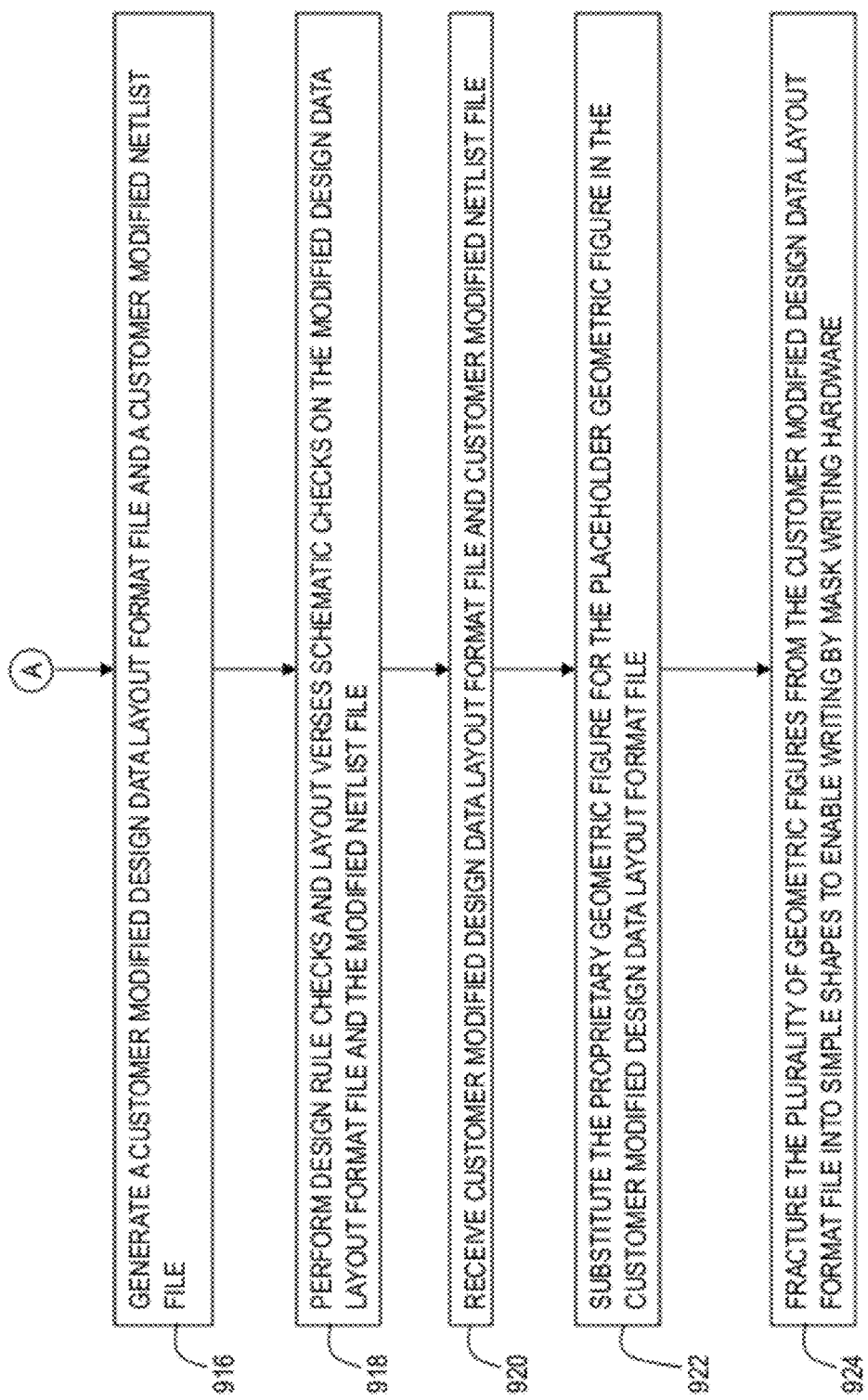
FIG. 6 is a continuation of the logic flowchart of FIG. 5 for the embodiment of the method of the modification process.

FIGS. 5-6 illustrate a computer-implemented method including a first computing device, (e.g., a VSLI IP developer's computer, etc.), generating a design data layout format file that defines a plurality of geometric figures and a netlist file that defines electrical connections between the geometric FIG. 900.

The first computing device identifies at least one proprietary geometric figure from the geometric figures. This identifying process includes, identifying an outer boundary of the proprietary geometric figure, identifying electrical interconnections and/or other physical interconnections to and from the proprietary geometric figure that pass through the outer boundary, and identifying specific peripheral structures of the proprietary geometric figure immediately adjacent the outer boundary 902. The proprietary geometric figures may be located on a plurality of semiconductor layers.

The first computing device then replaces the proprietary geometric figure in the design data layout format file with a placeholder geometric figure based on the identification of the proprietary geometric FIG. 904, and renames cell names and connection names associated with the proprietary geometric figure from the netlist file with obfuscating names (also based on the identification of the proprietary geometric figure) in item 906. The proprietary geometric figure may represent, for example, a portion of a VSLI circuit or a complete VSLI circuit.

The placeholder geometric figure may approximate a device density or a metal density of at least a portion of the proprietary geometric figure. Therefore, the placeholder geometric figure may also include a plurality of different device densities or a plurality of different metal densities. The placeholder geometric figure may also include a regular array of devices or metal structures that approximate the geometric shape of the proprietary geometric figure, where the placeholder geometric figure obfuscates design structure contained within the proprietary geometric figure. The first computing device then generates a modified design data layout format file that includes the placeholder geometric figure and generates a modified netlist file including the obfuscating names 908.

A second computing device (e.g., an VSLI circuit designer customer's computer, i.e., an IC designer, etc.) receives the modified design data layout format file and the modified netlist file 910. The obfuscating names may include alphanumeric text that obfuscates cell name or interconnection name information in the netlist file. The second computing device adds customer geometric figures to the modified design data layout format file 912, and customer electrical routing connection information to the modified netlist file based on the added customer geometric FIG. 914.

A customer modified design data layout format file may be generated, by the second computing device, with the customer geometric figures and a customer modified netlist file (with the customer electrical routing connection information) in item 916.

Design rule checks (DRC) and layout verses schematic checks (LVS) are performed on the modified design data layout format file (containing the customer geometric figures) and the modified netlist file (containing the customer electrical routing connection information) in item 918. The modified design data layout format file may be specifically designed such that the results from DRC and LVS may give the same results as the unmodified layout format file, thereby producing a meaningful result when step 918 is executed. In other words, the placeholder structures may be defined to provide the same DRC and/or LVS checking results as the original proprietary structure. The placeholder structures may also be defined to eliminate certain unwanted DRC and/or LVS violations (i.e., wavered violations or other violations that are not necessary for the IC designer/customer to address). Additionally, design rule checking may be carried out within a fixed distance of the outer boundary of the proprietary geometric figure.

A third computing device, (or in the alternative, the original first computing device, both computing devices which are at a 'trusted' location, independent from the "customer" location at the second computing device), may receive the a customer modified design data layout format file and the customer modified netlist file, 920, and substitute the proprietary geometric figure for the placeholder geometric figure in the customer modified design data layout format file 922. Finally, the geometric figures are fractured from the customer modified design data layout format file into simple shapes to enable writing by mask writing hardware 924.

As will be appreciated by one skilled in the art, aspects of the systems and methods herein may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
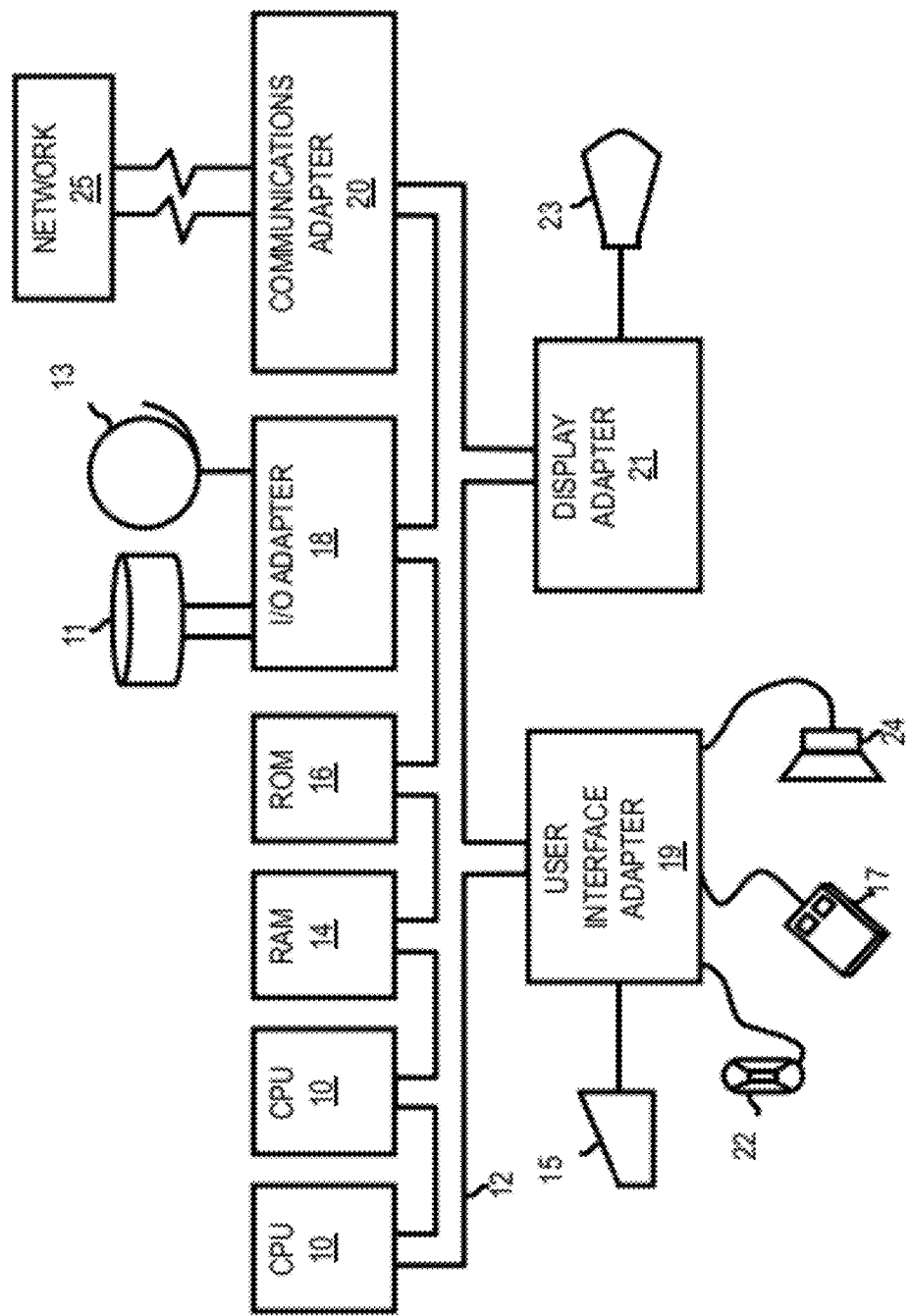
FIG. 7 is a schematic diagram of a hardware system according to embodiments herein.

A representative hardware environment for practicing the embodiments herein is depicted in FIG. 7. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server and proxy computers via loading a storage medium such as a CD, DVD, etc. The process software may also be automatically or semi-automatically deployed into a computer system by sending the process software to a central server or a group of central servers. The process software may be then downloaded into the client computers that will execute the process software. The process software may be sent directly to the client system via e-mail. The process software may be then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, and then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software may be then downloaded into the client computers that will execute the process software. Alternatively the process software may be sent directly to the client system via e-mail. The process software may be then either detached to a directory or loaded into a directory by a button on the e-mail that executes a program that detaches the process software into a directory. Another alternative may be to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 8:
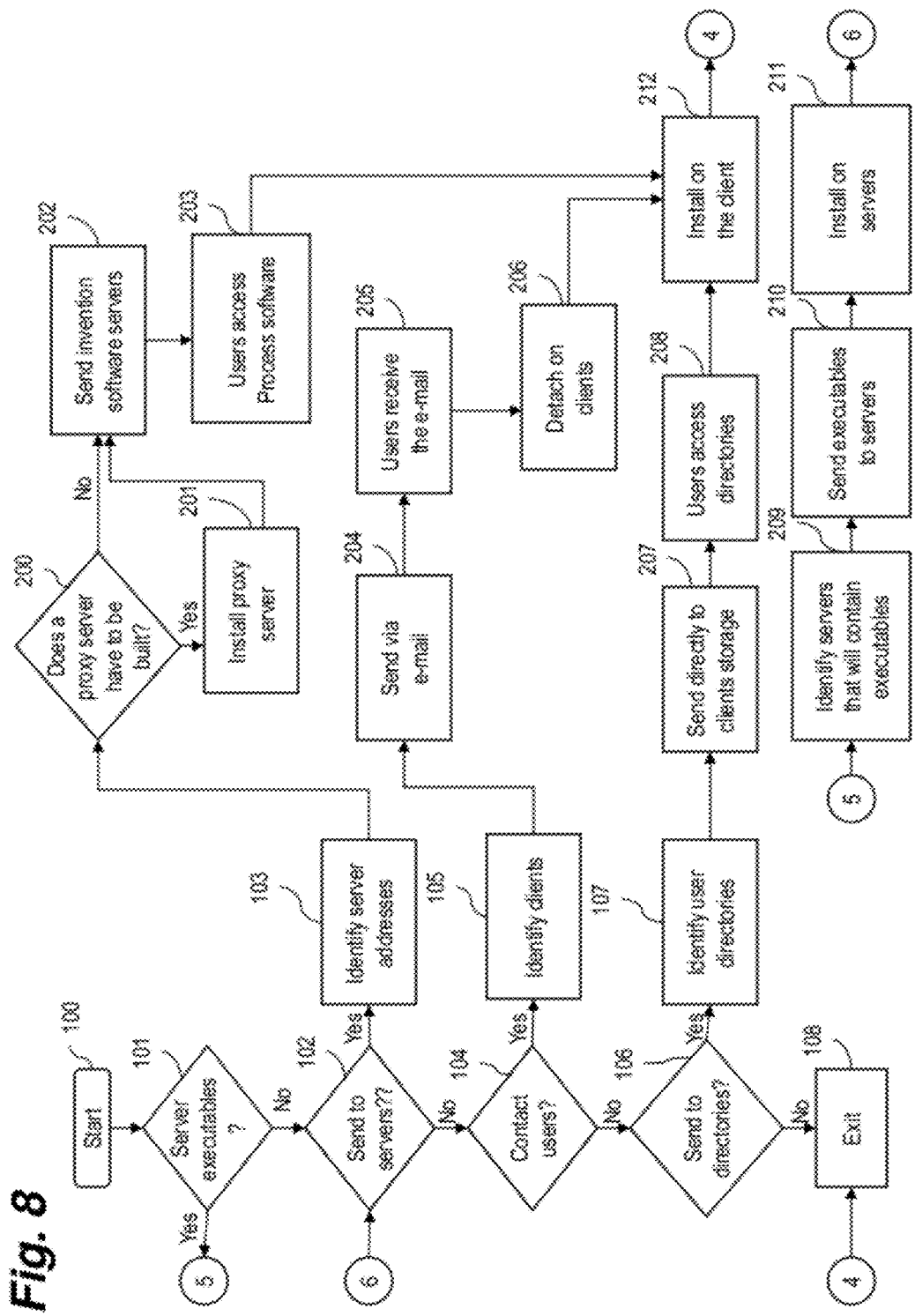
FIG. 8 is a schematic diagram of a deployment system according to embodiments herein.

In FIG. 8, Step 100 begins the deployment of the process software. The first thing may be to determine if there are any programs that will reside on a server or servers when the process software may be executed 101. If this is the case then the servers that will contain the executables are identified 209. The process software for the server or servers may be transferred directly to the servers' storage via FTP or some other protocol or by copying though the use of a shared file system 210. The process software may be then installed on the servers 211.

Next, a determination is made on whether the process software may be deployed by having users access the process software on a server or servers 102. If the users are to access the process software on servers then the server addresses that will store the process software are identified 103.

A determination is made if a proxy server may be to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server may be required then the proxy server may be installed 201. The process software is sent to the servers either via a protocol such as FTP or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment may be to have the servers automatically copy the process software to each client and then run the installation program for the process software at each client computer. The user executes the program that installs the process software on his client computer 212 then exits the process 108.

In step 104 a determination may be made whether the process software may be to be deployed by sending the process software to users via e-mail. The set of users where the process software will be deployed are identified together with the addresses of the user client computers 105. The process software may be sent via e-mail to each of the users' client computers. The users then receive the e-mail 205 and then detach the process software from the e-mail to a directory on their client computers 206. The user executes the program that installs the process software on his client computer 212 then exits the process 108.

Lastly a determination may be made on whether to the process software will be sent directly to user directories on their client computers 106. If so, the user directories are identified 107. The process software may be transferred directly to the user's client computer directory 207. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 208. The user executes the program that installs the process software on his client computer 212 then exits the process 108.

The process software may be integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration may be completed by installing the process software on the clients and servers.

Figure 9:
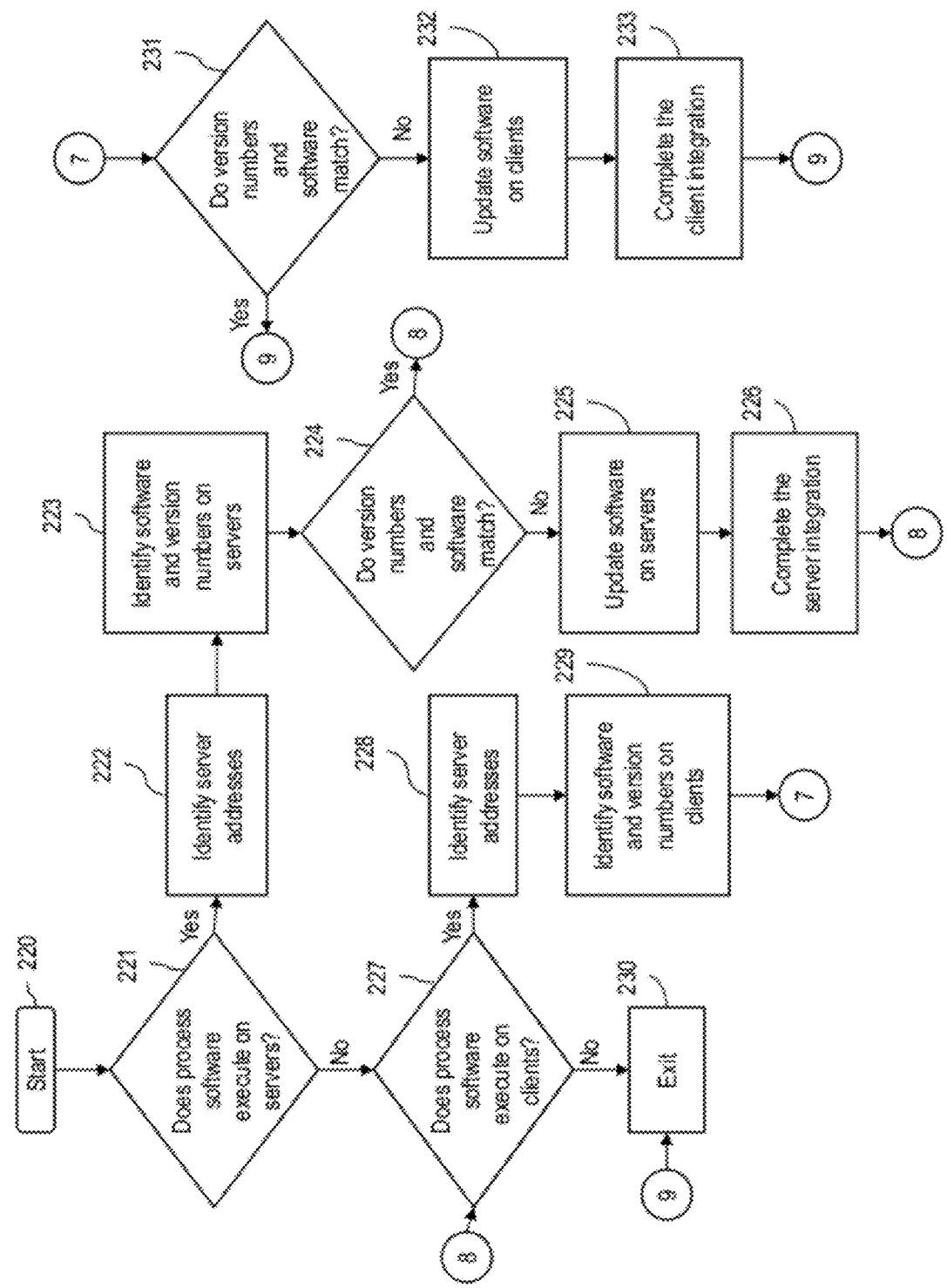
FIG. 9 is a schematic diagram of an integration system according to embodiments herein.

In FIG. 9, Step 220 begins the integration of the process software. The first thing may be to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers, that have been tested with the process software 223. The servers are also checked to determine if there is any missing software that may be required by the process software 223.

A determination may be made if the version numbers match the version numbers of OS, applications and NOS that have been tested with the process software 224. If all of the versions match and there is no missing required software the integration continues in 227.

If one or more of the version numbers do not match, then the unmatched versions are updated on the server or servers with the correct versions 225. Additionally if there is missing required software, then it is updated on the server or servers 225. The server integration may be completed by installing the process software 226.

Step 227 which follows either 221, 224 or 226 determines if there are any programs of the process software that will execute on the clients. If no process software programs execute on the clients the integration proceeds to 230 and exits. If this not the case, then the client addresses are identified 228.

The clients are checked to see if they contain software that includes the operating system (OS), applications, and network operating systems (NOS), together with their version numbers, that have been tested with the process software 229. The clients are also checked to determine if there may be any missing software that may be required by the process software 229.

A determination may be made as to whether the version numbers match the version numbers of OS, applications and NOS that have been tested with the process software 231. If all of the versions match and there is no missing required software, then the integration proceeds to 230 and exits.

If one or more of the version numbers do not match, then the unmatched versions are updated on the clients with the correct versions 232. In addition, if there is missing required software then it may be updated on the clients 232. The client integration may be completed by installing the process software on the clients 233. The integration proceeds to 230 and exits.

The process software can be stored on a shared file system accessible from one or more servers. The process software may be executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise when other measurements of use such as network bandwidth, memory usage, storage usage, etc. approach a capacity so as to effect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider may be also a customer of the customer that uses the process software application, the payment owed to the service provider may be reconciled to the payment owed by the service provider to minimize the transfer of payments.

The process software may be shared, simultaneously serving multiple customers in a flexible, automated fashion. It may be standardized, requiring little customization and it may be scalable, providing capacity on demand in a pay-as-you-go model.

The process software can be stored on a shared file system accessible from one or more servers. The process software may be executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider may be reconciled to the payment owed by the service provider to minimize the transfer of payments.

Figure 10:
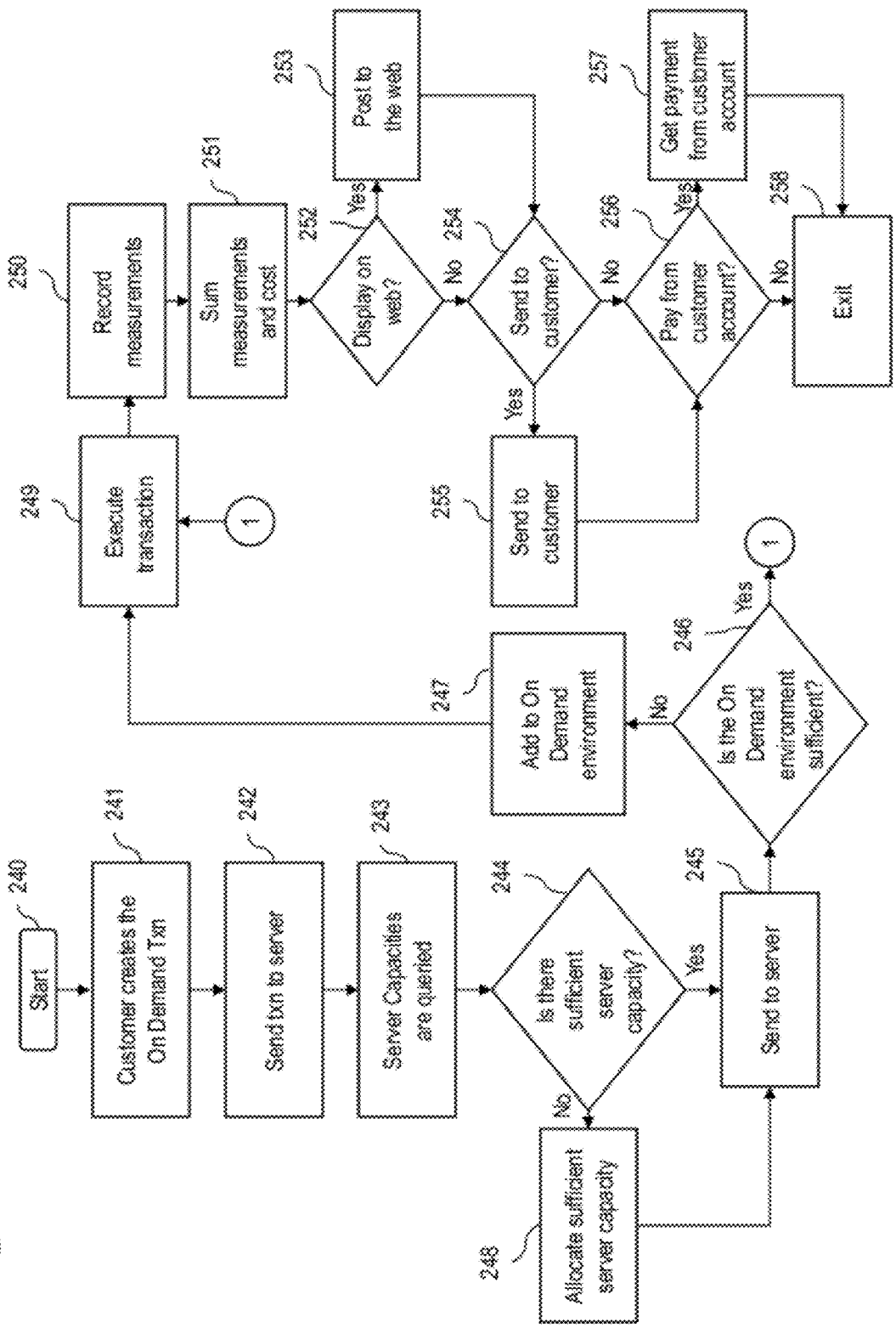
FIG. 10 is a schematic diagram of an on demand system according to embodiments herein.

In FIG. 10, Step 240 begins the On Demand process. A transaction may be created than contains the unique customer identification, the requested service type and any service parameters that further specify the type of service 241. The transaction may be then sent to the main server 242. In an On Demand environment the main server can initially be the only server, then as capacity may be consumed other servers are added to the On Demand environment.

The server central processing unit (CPU) capacities in the On Demand environment are queried 243. The CPU requirement of the transaction may be estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity may be allocated to process the transaction 248. If there was already sufficient Available CPU capacity then the transaction is sent to a selected server 245.

Before executing the transaction, a check may be made of the remaining On Demand environment to determine if the environment has sufficient available capacity for processing the transaction. This environment capacity consists of such things as but not limited to network bandwidth, processor memory, storage etc. 246. If there is not sufficient available capacity, then capacity will be added to the On Demand environment 247. Next the required software to process the transaction may be accessed, loaded into memory, then the transaction may be executed 249.

The usage measurements are recorded 250. The usage measurement consists of the portions of those functions in the On Demand environment that is used to process the transaction. The usage of such functions as, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment may be received directly from the customer account 257. The last step is exit the On Demand process.

The process software may be deployed, accessed and executed through the use of a virtual private network (VPN), which is any combination of technologies that can be used to secure a connection through an otherwise unsecured or untrusted network. The use of VPNs may be to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software may be deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software may be deployed, accessed and executed through the use of dedicated equipment and large-scale encryption that are used to connect a company's multiple fixed sites over a public network such as the Internet.

The process software may be transported over the VPN via tunneling which is the process of placing an entire packet within another packet and sending it over a network. The protocol of the outer packet may be understood by the network and both points, called tunnel interfaces, where the packet enters and exits the network.

Figure 11:
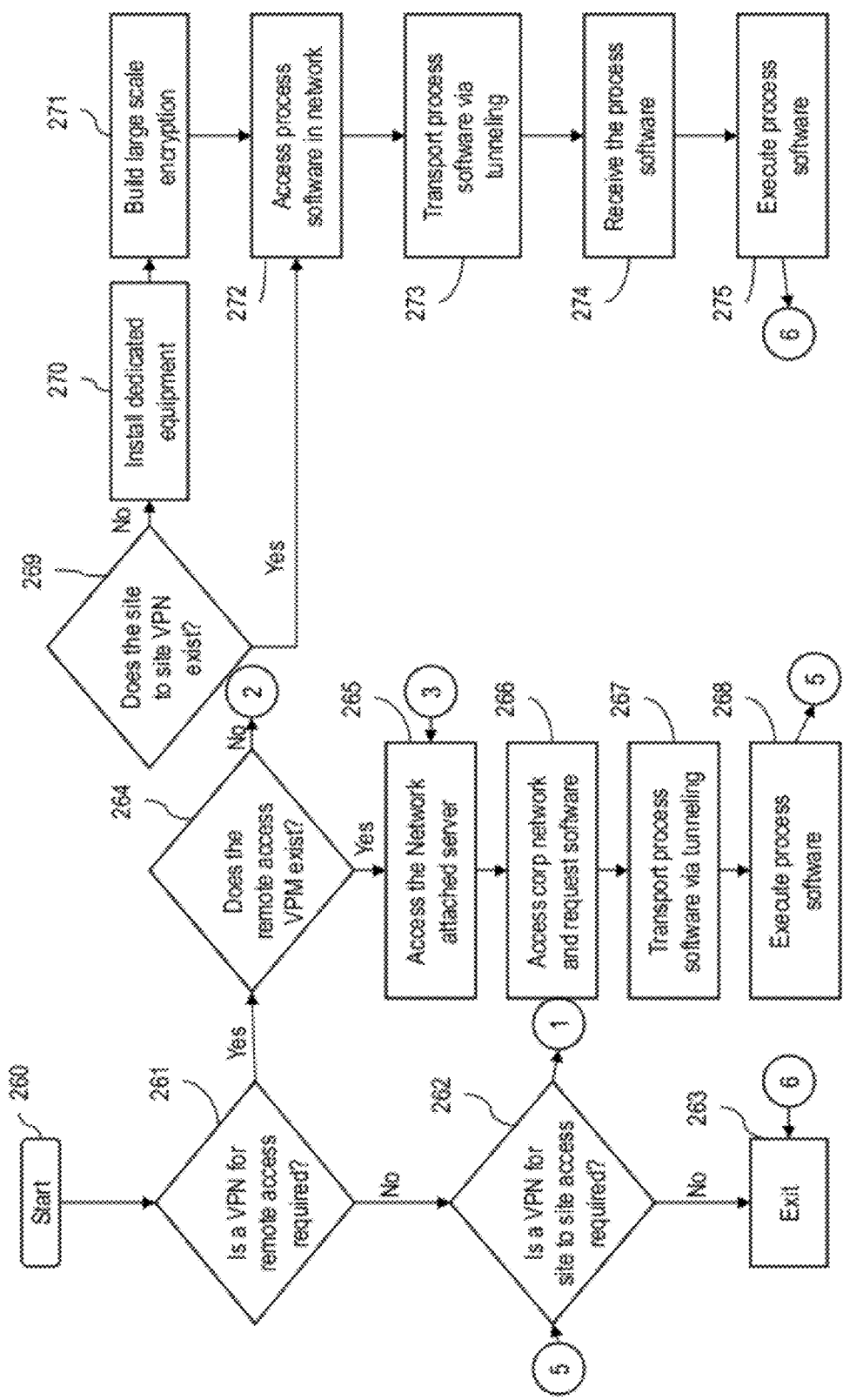
FIG. 11 is a schematic diagram of a virtual private network system according to embodiments herein.
Figure 12:
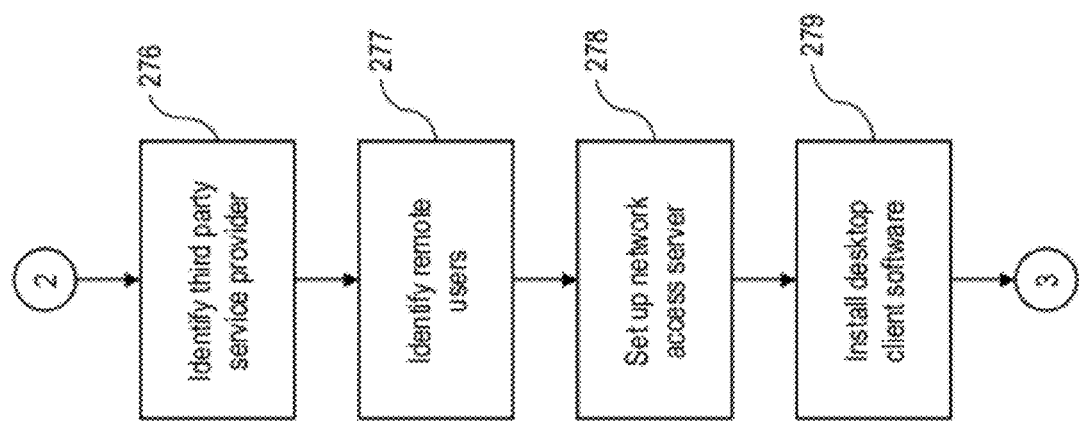
FIG. 12 is a schematic diagram of a virtual private network system according to embodiments herein.

In FIGS. 11 and 12, Step 260 begins the Virtual Private Network (VPN) process. A determination may be made to see if a VPN for remote access is required 261. If it is not required, then proceed to 262. If it is required, then determine if the remote access VPN exists 264.

If it does exist, then proceed to 265. Otherwise identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built or if it been previously installed, the remote users can then access the process software by dialing into the NAS or attaching directly via a cable or DSL modem into the NAS 265. This allows entry into the corporate network where the process software may be accessed 266. The process software may be transported to the remote user's desktop over the network via tunneling. That is the process software may be divided into packets and each packet including the data and protocol may be placed within another packet 267. When the process software arrives at the remote user's desktop, it may be removed from the packets, reconstituted and then may be executed on the remote users desktop 268.

A determination is made to see if a VPN for site to site access may be required 262. If it is not required, then proceed to exit the process 263. Otherwise, determine if the site to site VPN exists 269. If it does exist, then proceed to 272. Otherwise, install the dedicated equipment required to establish a site to site VPN 270. Then build the large scale encryption into the VPN 271.

After the site to site VPN has been built or if it had been previously established, the users access the process software via the VPN 272. The process software may be transported to the site users over the network via tunneling. That is the process software may be divided into packets and each packet including the data and protocol may be placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
   generating, by a first computing device, a design data layout format file that defines a plurality of geometric figures and a netlist file that defines electrical connections between said plurality of geometric figures;
   identifying, by said first computing device, a proprietary geometric figure from said plurality of geometric figures, said identifying comprising:
      identifying an outer boundary of said proprietary geometric figure;
      identifying electrical interconnections to and from said proprietary geometric figure that pass through said outer boundary; and
      identifying specific peripheral structures of said proprietary geometric figure immediately adjacent said outer boundary;
   replacing, by said first computing device, said proprietary geometric figure in said design data layout format file with a placeholder geometric figure;
   renaming, by said first computing device, at least one of a cell name and a connection name associated with said proprietary geometric figure from said netlist file with obfuscating names; and
   generating, by said first computing device, a modified design data layout format file including said placeholder geometric figure and a modified netlist file including said obfuscating names.

2. The computer-implemented method according to claim 1, further comprising:
   receiving, at a second computing device, said modified design data layout format file and said modified netlist file;
   adding, by said second computing device, customer geometric figures to said modified design data layout format file;
   adding, by said second computing device, customer electrical routing connection information to said modified netlist file based on said adding of said customer geometric figures;
   generating, by said second computing device, a customer modified design data layout format file with said customer geometric figures and a customer modified netlist file with said customer electrical routing connection information; and
   performing, by said second computing device, one of design rule checks and layout verses schematic checks on said modified design data layout format file containing said customer geometric figures and said modified netlist file containing said customer electrical routing connection information.

3. The computer-implemented method according to claim 2, said performing of said design rule checks further comprising design rule checking within a fixed distance proximate said outer boundary of said proprietary geometric figure.

4. The computer-implemented method according to claim 2, further comprising:
   receiving, by a third computing device said a customer modified design data layout format file and said customer modified netlist file;
   substituting, by said third computing device, said proprietary geometric figure for said placeholder geometric figure in said customer modified design data layout format file, and said at least one of said cell name and said connection name associated with said proprietary geometric figure for said obfuscating names in said customer modified netlist file; and
   fracturing, by said third computing device, said plurality of geometric figures from said customer modified design data layout format file into simple shapes to enable writing by mask writing hardware.

5. The computer-implemented method according to claim 1, said proprietary geometric figure located on a plurality of semiconductor layers.

6. The computer-implemented method according to claim 1, said placeholder geometric figure approximating one of a device density and a metal density of at least a portion of said proprietary geometric figure.

7. The computer-implemented method according to claim 6, said placeholder geometric figure comprising one of a plurality of different device densities and a plurality of different metal densities.

8. A computer-implemented method comprising generating, by a computing device, a design data layout format file that defines a plurality of geometric figures and a netlist file that defines electrical connections between said plurality of geometric figures:
   identifying, by said computing device, a proprietary geometric figure from said plurality of geometric figures within said design data layout format file, said identifying comprising:
      identifying an outer boundary of said proprietary geometric figure;
      identifying electrical interconnections to and from said proprietary geometric figure that pass through said outer boundary; and
      identifying specific peripheral structures of said proprietary geometric figure immediately adjacent said outer boundary;
   replacing, by said computing device, said at least one proprietary geometric figure in said design data layout format file with a placeholder geometric figure;
   renaming, by said computing device, at least one of a cell name and a connection name associated with said proprietary geometric figure from said netlist file that define electrical connections between said plurality of geometric figures with obfuscating names; and generating, by said computing device, a modified design data layout format file including said placeholder geometric figure and a modified netlist file including said obfuscating names.

9. The computer-implemented method according to claim 8, said placeholder geometric figure comprising a regular array of one of devices and metal structures that approximate the geometric shape of said proprietary geometric figure, said placeholder geometric figure obfuscating design structure contained within said proprietary geometric figure.

10. The computer-implemented method according to claim 8, said obfuscating names comprising alphanumeric text that obfuscates one of said at least one of said cell name and said connection name information in said netlist file.

11. The computer-implemented method according to claim 8, said proprietary geometric figure representing at least a portion of a Very Large-Scale Integrated (VLSI) circuit.

12. The computer-implemented method according to claim 8, said replacing further comprising:

adding, by said computing device, at least one of null value devices and text labels around at least a portion of said placeholder geometric figure that ensure electrical shorts are identified during layout verses schematic checks on said modified design data layout format file and said modified netlist file.

13. The computer-implemented method according to claim 8, further comprising:

performing, by said computing device, design rule checks and layout verses schematic checks on said modified design data layout format file containing said customer geometric figures and said modified netlist file containing said customer electrical routing connection information.

14. The computer-implemented method according to claim 8, further comprising:

substituting, by said computing device, said proprietary geometric figure for said placeholder geometric figure, and said at least one of said cell name and said connection name associated with said proprietary geometric figure for said obfuscating names.

15. A non-transitory computer storage medium readable by a computer tangibly embodying a program of instructions executable by said computer for performing a method for generating a modified design data layout format file and a modified netlist file, said method comprising:

generating a design data layout format file that defines a plurality of geometric figures and a netlist file that defines electrical connections between said plurality of geometric figures;

identifying at least one proprietary geometric figure from said plurality of geometric figures, said identifying comprising:

identifying an outer boundary of said at least one proprietary geometric figure;

identifying electrical interconnections to and from said at least one proprietary geometric figure that pass through said outer boundary; and identifying specific peripheral structures of said at least one proprietary geometric figure immediately adjacent said outer boundary;

replacing said at least one proprietary geometric figure in said design data layout format file with a placeholder geometric figure;

renaming at least one of a cell name and a connection name associated with said at least one proprietary geometric figure from said netlist file with obfuscating names; and generating said modified design data layout format file including said placeholder geometric figure and said modified netlist file including said obfuscating names.

16. The non-transitory computer storage medium according to claim 15, further comprising:

adding customer geometric figures to said modified design data layout format file;

adding customer electrical routing connection information to said modified netlist file based on said adding of said customer geometric figures;

performing design rule checks and layout verses schematic checks on said modified design data layout format file containing said customer geometric figures and said modified netlist file containing said customer electrical routing connection information; and generating a customer modified design data layout format file with said customer geometric figures and a customer modified netlist file with said customer electrical routing connection information.

17. The non-transitory computer storage medium according to claim 16, further comprising:

receiving said customer modified design data layout format file and said customer modified netlist file;

substituting said at least one proprietary geometric figure for said placeholder geometric figure in said customer modified design data layout format file, and said at least one of said cell name and said connection name associated with said at least one proprietary geometric figure for said obfuscating names in said customer modified netlist file; and fracturing said plurality of geometric figures from said customer modified design data layout format file into simple shapes to enable writing by mask writing hardware.

18. The non-transitory computer storage medium according to claim 15, said replacing further comprising:

replacing said at least one proprietary geometric figure in said design data layout format file with a regular array that approximates one of a device density and a metal density of at least a portion of said at least one proprietary geometric figure.

19. The non-transitory computer storage medium according to claim 18, said replacing further comprising:

replacing said at least one proprietary geometric figure in said design data layout format file with a plurality of regular arrays, each regular array having one of a different device density and a different metal density.

20. The non-transitory computer storage medium according to claim 15, said replacing further comprising:

replacing said at least one proprietary geometric figure in said design data layout format file with said placeholder geometric figure that obfuscates design structure contained within said at least one proprietary geometric figure; and replacing one of said cell name and said interconnect name information with said obfuscating names in said netlist file that obfuscates one of said cell name and said interconnection name information.

* * * * *